(12) United States Patent
Choi et al.

(10) Patent No.: US 11,056,420 B2
(45) Date of Patent: Jul. 6, 2021

(54) PRESSING-TYPE SEMICONDUCTOR POWER DEVICE PACKAGE

(71) Applicant: JMJ KOREA CO., LTD., Bucheon-si (KR)

(72) Inventors: Yunhwa Choi, Bucheon-si (KR); Jeonghun Cho, Goyang-si (KR); Jungtae Cho, Seoul (KR)

(73) Assignee: JMJ KOREA CO., LTD., Bucheon-si (KR)

( * ) Notice: Subject to any disclaimer, the term of this patent is extended or adjusted under 35 U.S.C. 154(b) by 238 days.

(21) Appl. No.: 16/226,937

(22) Filed: Dec. 20, 2018

(65) Prior Publication Data
US 2019/0259686 A1 Aug. 22, 2019

(30) Foreign Application Priority Data
Feb. 19, 2018 (KR) .................. 10-2018-0019340

(51) Int. Cl.
*H01L 23/492* (2006.01)
*H01L 23/32* (2006.01)
(52) U.S. Cl.
CPC ............ *H01L 23/492* (2013.01); *H01L 23/32* (2013.01)

(58) Field of Classification Search
CPC .................. H01L 23/492; H01L 23/32
See application file for complete search history.

(56) References Cited

U.S. PATENT DOCUMENTS

| 8,054,633 B2 * | 11/2011 | Suwa ................ H02M 7/003 361/728 |
| 2010/0091477 A1 * | 4/2010 | Takagi .............. H01L 24/49 361/820 |
| 2012/0235162 A1 * | 9/2012 | Isobe ................ H01L 23/473 257/77 |

FOREIGN PATENT DOCUMENTS

CN 103489856 A 1/2014

* cited by examiner

*Primary Examiner* — Thao X Le
*Assistant Examiner* — Xia L Cross
(74) *Attorney, Agent, or Firm* — KORUS Patent, LLC; Seong Il Jeong

(57) ABSTRACT

The present invention relates generally to a pressing-type semiconductor power device package, and more specifically to a pressing-type semiconductor power device package in which a semiconductor chip, such as a transistor or diode, is formed into a package via a pressing structure without using any conductive adhesive, such as solder, which is used in the past, thereby improving production efficiency and durability.

9 Claims, 9 Drawing Sheets

PRESSING-TYPE SEMICONDUCTOR POWER DEVICE PACKAGE

CROSS-REFERENCE TO RELATED APPLICATION

This application claims the benefit of Korean Patent Application No. 10-2018-0019340 filed on Feb. 19, 2018, which is hereby incorporated by reference herein in its entirety.

BACKGROUND

1. Technical Field

The present invention relates generally to a pressing-type semiconductor power device package, and more specifically to a pressing-type semiconductor power device package in which a semiconductor chip, such as a transistor or diode, is formed into a package via a pressing structure without using any conductive adhesive, such as solder, which is used in the past, thereby improving production efficiency and durability.

2. Description of the Related Art

In general, a semiconductor chip package is formed by mounting a semiconductor chip on a substrate and connecting the semiconductor chip to a lead frame by clips or bonding wires. Furthermore, a package body is formed by molding a thermosetting material, such as an epoxy molding compound (EMC), around a semiconductor chip.

Conventional semiconductor packages usually use conductive adhesives, such as solder, for the purpose of establishing electrical connections with the terminals of semiconductor chips. The use of such a conductive adhesive causes problems in that the operation of a semiconductor package is highly influenced by temperature (the melting point of the adhesive) and manufacturing cost increases when expensive silver sintering or copper paste is employed. In addition, when an assembly defect or device breakage is found through characteristic inspection after the completion of the assembly of a semiconductor package, an inefficiency problem occurs in that the overall package needs to be discarded because it is difficult to separately replace a corresponding part.

Although semiconductor package-related technologies are disclosed in Korean Patent Application Publication No. 10-2014-0136268, Korean Patent No. 10-1301782, and Korean Patent Application Publication No. 10-2016-0056378, the above related technologies do not overcome the above problems because they include bonding wires and conductive adhesives.

SUMMARY

Therefore, an object of the present invention is to provide a semiconductor power device package that is constructed using physical pressing members without using an adhesive such as solder.

In order to accomplish the above object, the present invention provides a semiconductor power device package, including: at least one upper metal plate located above a device; and at least one lower metal plate located below the device; wherein one or more coupling holes are formed in each of the upper and lower metal plates, and the upper and lower metal plates are fastened and structurally connected by pressing members passing through the coupling holes, so that electrical connections are established among the device and the upper and lower metal plates.

Each of the pressing members may include a head that is disposed in the upper portion of the pressing member and a rod that protrudes downward from the bottom surface of the head, wherein a coupling depression may be formed in the center portion of the top surface of the head.

Each of the pressing members may be formed in a pin shape.

Threads may be formed on the rod or coupling depression of each of the pressing members.

The device may be a transistor chip, the upper metal plate may include, sequentially from the top thereof, a first metal plate responsible for a gate and a second metal plate responsible for an emitter, and the lower metal plate may include a third metal plate responsible for a collector.

At least one coupling hole may be formed in the center of the first metal plate and at least one coupling hole may be formed in the corner or side-adjacent portion of the first metal plate, at least one coupling hole may be formed in the center of the second metal plate and at least one coupling hole may be formed in the corner or side-adjacent portion of the second metal plate at locations corresponding to the locations of the coupling holes of the first metal plate, and at least one coupling hole may be formed in the center of the third metal plate and at least one coupling hole may be formed in the corner or side-adjacent portion of the third metal plate at locations corresponding to the locations of the coupling holes of the second metal plate.

The transistor chip may be mounted on the top surface of the third metal plate, and a conductive spacer that is electrically connected to the second metal plate may be installed above the transistor chip.

A slot having a size larger than the diameter of the pressing members may be formed in the spacer, and the pressing member having passed through the coupling hole in the centers of the first metal plate and the second metal plate may pass through the slot of the spacer and come into contact with the transistor chip, so that an electrical connections with the first metal plate and the transistor chip are established.

The device may be a diode chip, the upper metal plate may include a first metal plate responsible for an anode, and the lower metal plate may include a second metal plate responsible for a cathode.

At least one coupling hole may be formed in the corner or side-adjacent portion of the first metal plate, and at least one coupling hole may be formed in the corner or side-adjacent portion of the second metal plate at a location corresponding to the location of the coupling hole of the first metal plate.

The diode chip may be mounted on the top surface of the second metal plate, and a conductive spacer that is electrically connected to the first metal plate may be installed above the diode chip.

The pressing members may directly fasten the first metal plate and the second metal plate without coming into contact with the diode chip and the spacer.

The transistor chip may be one of an IGBT, a MOSFET, a SiC semiconductor power device, and a GaN semiconductor power device.

Furthermore, the present invention provides an electronic device, comprising the above-described semiconductor power device package.

BRIEF DESCRIPTION OF THE DRAWINGS

The above and other objects, features, and advantages of the present invention will be more clearly understood from the following detailed description taken in conjunction with the accompanying drawings, in which:

FIG. 7b is a sectional view taken along line A-A' of FIG. 7a;

DETAILED DESCRIPTION

Preferred embodiments of the present invention will be described in detail below with reference to the accompanying drawings. Furthermore, in the following description of the present invention, when it is determined that a detailed description of a related well-known function or configuration may unnecessarily make the gist of the present invention obscure, the detailed description will be omitted.

The present invention is characterized by constructing a circuit by packaging a semiconductor power chip, i.e., a semiconductor power device, with multilayer metal plates by means of a pressing method. The chip is mounted on the lower metal plate, and one or more metal plates are installed above the chip.

The semiconductor power device is a semiconductor device for a power apparatus. Such semiconductor power devices are optimized for power conversion or control, and are key elements of power electronics. They are designed for higher-voltage withstanding, higher current, and higher frequency than common semiconductor devices. They include a rectifier diode, a power MOSFET, an insulated gate bipolar transistor (IGBT), a thyristor, a gate turn-off thyristor (GTO), and a triac.

Although a transistor chip and a diode chip selected from among semiconductor power devices will be described in the following embodiments of the present invention by way of example, the present invention is not limited thereto, but the present invention may be applied to all power chips that may be formed into semiconductor packages.

1. First Embodiment—Transistor Package

Figure 1:
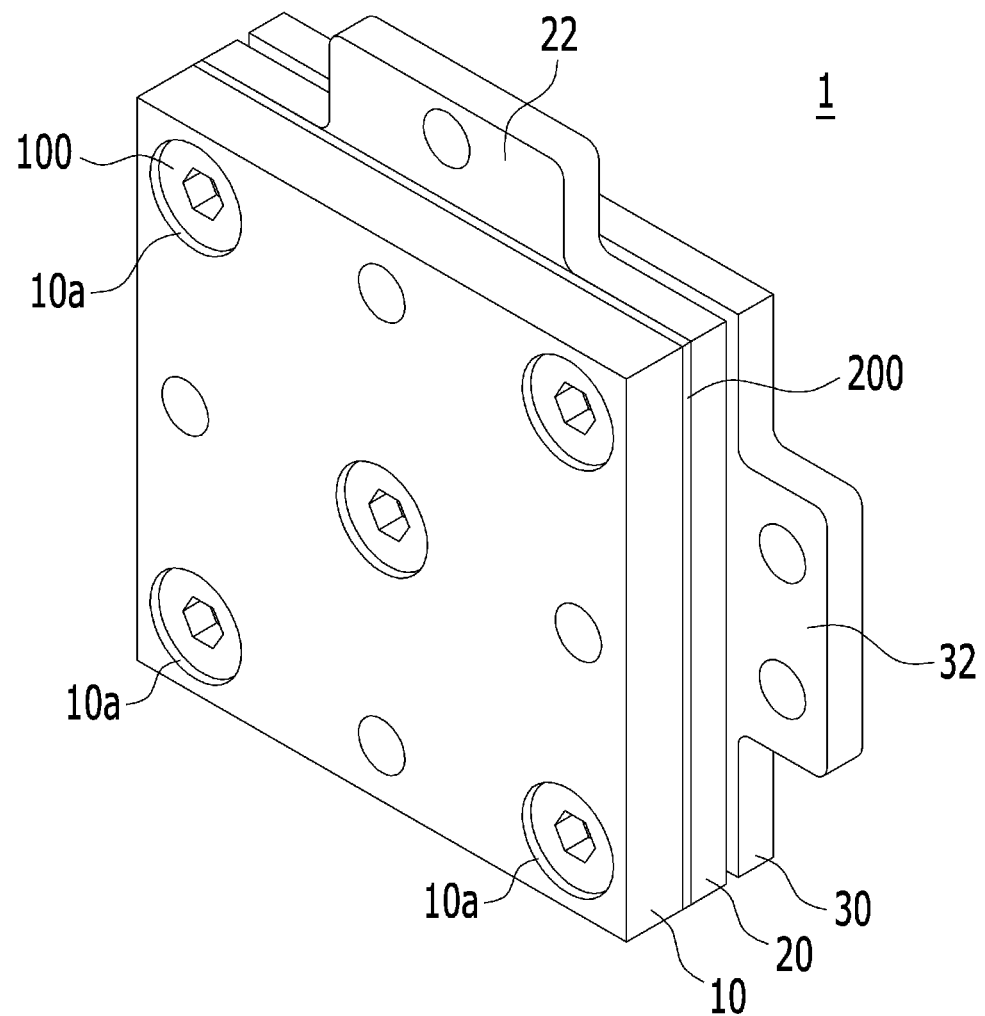
FIG. 1 is an overall perspective view of a transistor package according to an embodiment of the present invention.

FIG. 1 is an overall perspective view of a transistor module or package 1 according to a first embodiment of the present invention. The transistor package 1 includes, sequentially from the front thereof: a first metal plate 10 connected to the gate terminal of a transistor chip, and configured to be responsible for a gate; a second metal plate 20 connected to the emitter terminal of the transistor chip, and configured to be responsible for an emitter; an insulating plate 200 configured to block an electrical connection between the first metal plate 10 and the second metal plate 20; and a third metal plate 30 configured to be responsible for a collector. A spacer 40 (see FIG. 5) and a transistor chip 50 (see FIG. 5) are interposed between the second metal plate 20 and the third metal plate 30.

A structural feature of the transistor package 1 according to the present embodiment of the present invention resides in that the first metal plate 10, the second metal plate 20, and the third metal plate 30 are securely coupled to one another by using pressing members 100 in an integrated manner.

Another structural feature of the transistor package 1 according to the present embodiment of the present invention resides in that the circuit terminals of the transistor chip 50 are electrically connected to the first, second and third metal plates 10, 20 and 30 accurately and stably and electrical conductions are maintained.

Individual components constituting the transistor package 1 according to the present embodiment of the present invention will be described in detail below.

Figure 2:
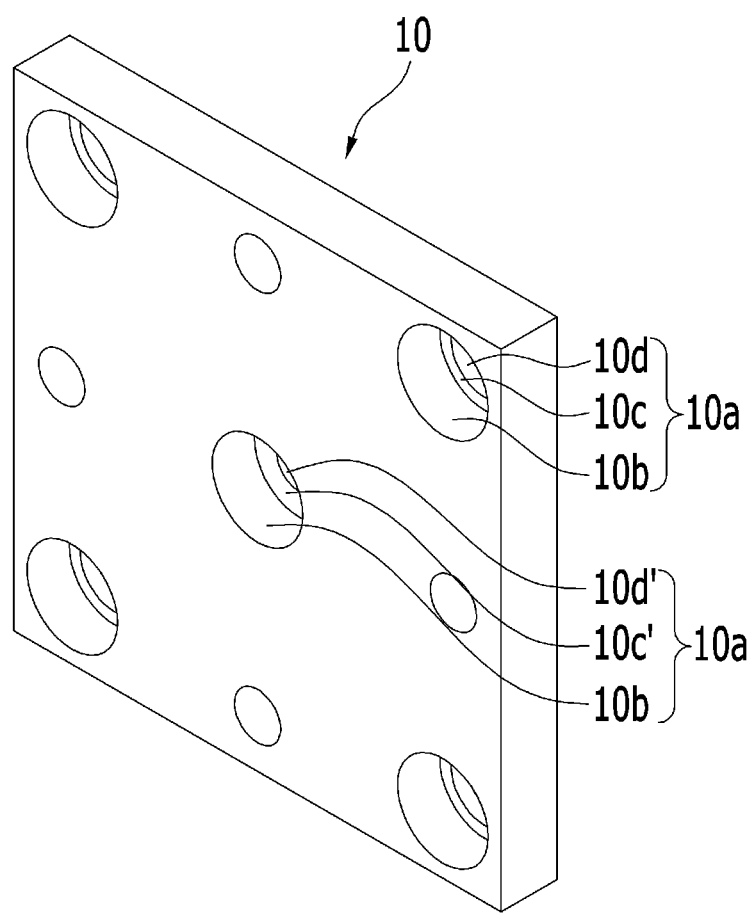
FIG. 2 is a perspective view of a first metal plate according to the embodiment of the present invention.

FIG. 2 is a perspective view of the first metal plate 10 according to the present embodiment of the present invention.

Referring to FIGS. 1 and 2 together, a total of five coupling holes 10a are formed in the center and four corners of the first metal plate 10. Each of the coupling holes 10a in the corners includes a first hole 10b formed in a circular opening shape, a support surface 10c configured to extend inward and horizontally from the lower end of the first hole 10b and formed in a rim shape, and a second hole 10d configured to extend downward from the support surface 10c. The diameter of the first hole 10b is larger than that of the second hole 10d. Although the coupling hole 10a in the center is similar to the coupling holes 10a in the corners, the width of a support surface 10c' is larger than that of the support surface 10c. Accordingly, the diameter of a second hole 10d' is formed to be smaller than that of the second hole 10d.

The above-described structures are constructed in accordance with the electrical connections among the components and the shapes of the pressing members 100 by way of example, and thus the structures and shapes of the coupling holes 10a may be appropriately changed. The installation locations and sizes of the pressing members 100 may be also appropriately changed, and do not limit the scope of the present invention.

Figure 3:
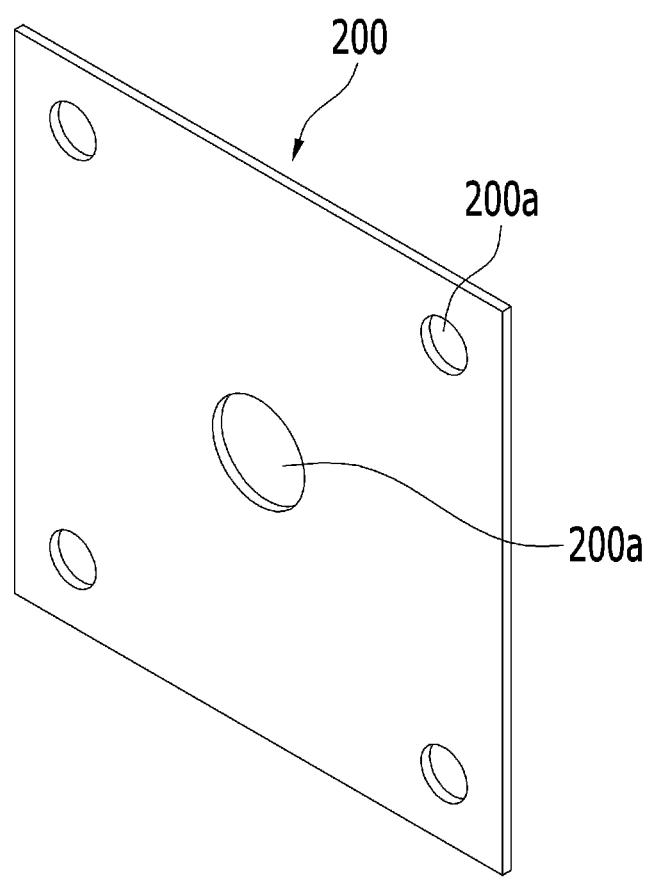
FIG. 3 is a perspective view of an insulating plate according to the embodiment of the present invention.

FIG. 3 is a perspective view of the insulating plate 200 according to the present embodiment of the present invention. A total of five coupling holes 200a are formed in the center and four corners of the insulating plate 200. The coupling holes 200a are formed at locations that are aligned with those of the coupling holes 10a. The diameter of the coupling hole 200a in the center is formed to be larger than that of the coupling hole 200a. For example, the diameter of the coupling hole 200a in the center is formed to be the same as that of the first hole 10b. Furthermore, the diameter of the coupling holes 200a in the corners may be formed to be the same as that of the second holes 10d.

Figure 4:
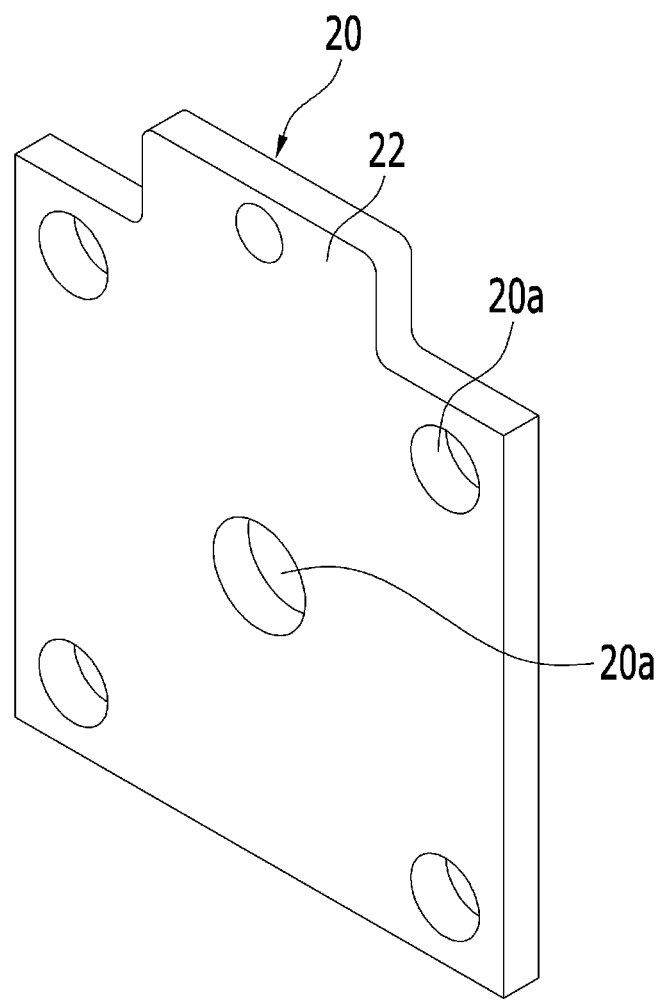
FIG. 4 is a perspective view of a second metal plate according to the embodiment of the present invention.

FIG. 4 is a perspective view of the second metal plate 20 according to the present embodiment of the present invention. A total of five coupling holes 20a are formed in the center and four corners of the second metal plate 2. The coupling holes 20a are formed at locations that are aligned with those of the coupling holes 200a. The diameter of the coupling hole 20a in the center may be formed to be the same as the first hole 10b and the diameter of the coupling hole 20a in the corners may be formed to be the same as that of the second holes 10d in the same manner as the insulating plate 200. Reference numeral 22 denotes the terminal of the emitter.

Figure 5:
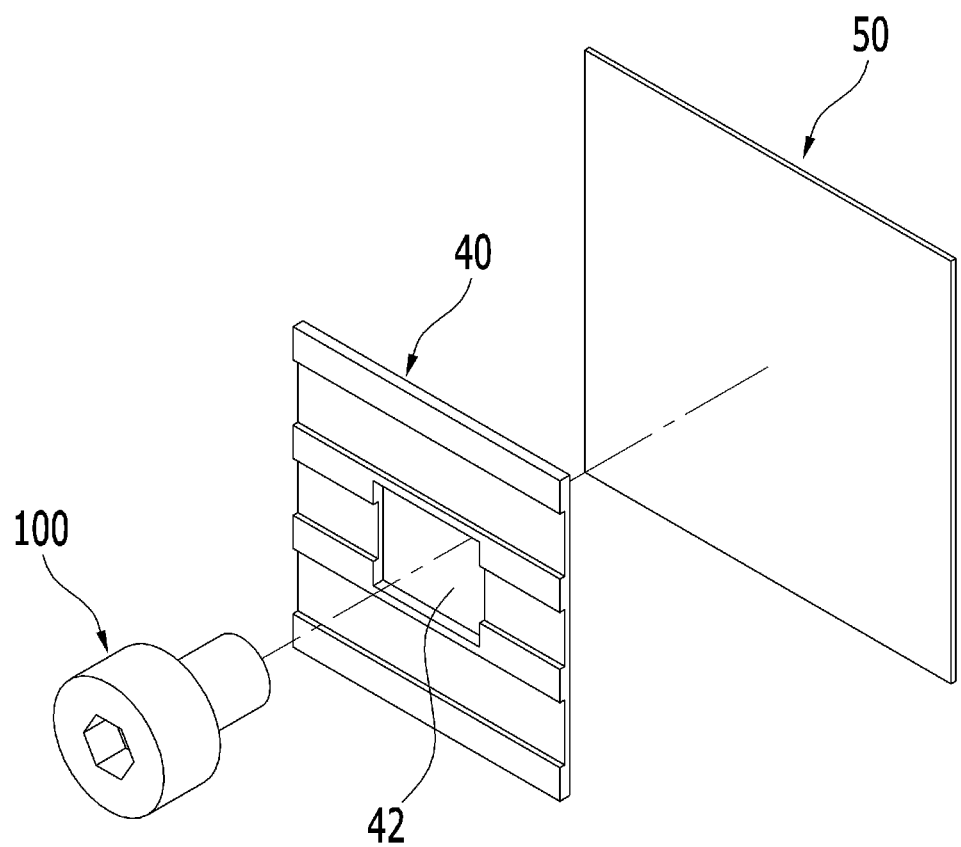
FIG. 5 is a perspective assembled view of a spacer and a transistor chip according to the embodiment of the present invention.

FIG. 5 is a perspective assembled view of the spacer 40 and the transistor chip 50 according to the present embodiment of the present invention. The spacer 40 made of an electrically conductive material is disposed on a front side, and the transistor chip 50 formed to have a larger area than the spacer 40 is disposed on a back side. A rectangular open slot 42 is formed in the center of the spacer 40. The center pressing member 100 passes through the slot 42, as shown in the drawing. The slot 42 is designed to have a size that prevents the slot 42 from coming into contact with the pressing member 100.

Protrusions and depressions are formed on the back surface of the spacer 40 through raised or depressed engraving, and thus avoid coming into contact with the fine section lines of the transistor chip 50. The second metal plate 20 located in front of the spacer 40 is electrically connected to the emitter terminal of the transistor chip 50, and secures electrical conductivity. Furthermore, the third metal plate 30 that comes into contact with a circuit pattern on the back surface of the transistor chip 50 is electrically connected to the collector terminal, and thus secures electrical conductivity.

An electrical connection between the first metal plate 10 and the transistor chip 50 is established in such a manner that the front end of the center pressing member 100 sequentially passes through the coupling holes 10a, 200a and 20a and the slot 42 and comes into contact with the gate terminal circuit of the transistor chip 50. Accordingly, at least part of the center pressing member 100 is made of a conductive material. In this case, the diameter of the center coupling holes 200a and 20a disposed in back of the first metal plate 10 may be formed to be sufficiently large, for example, to be the same as that of the first hole 10b as described above, so that the center pressing member 100 comes into contact with the first metal plate 10 and does not come into contact with the second metal plate 20, the insulating plate 200, and the spacer 40. The center pressing member 100 may be viewed as not only a pressing member but also a "gate pin" in that it electrically connects the first metal plate 10 and the transistor chip 50 as a gate.

Figure 6:
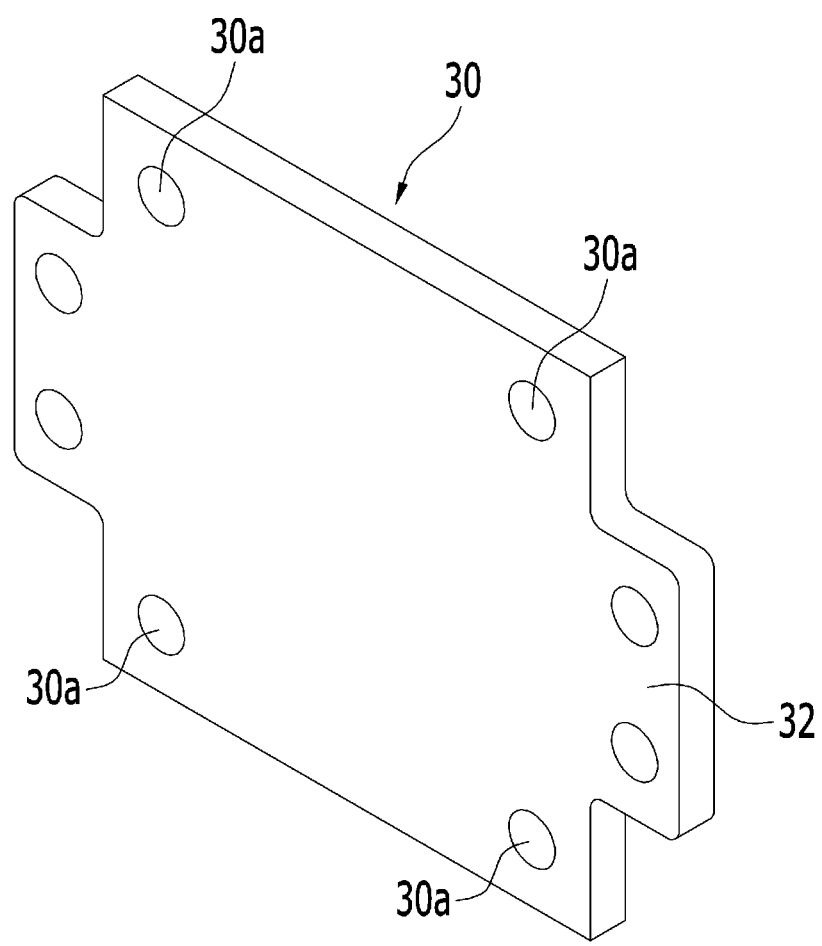
FIG. 6 is a perspective view of a third metal plate according to the embodiment of the present invention.

FIG. 6 is a perspective view of the third metal plate 30 according to the present embodiment of the present invention. Coupling holes 30a are formed in the four corners of the third metal plate 20. The coupling holes 30a are formed at locations that are aligned with those of the coupling holes 200a. The diameter of the coupling holes 30a may be formed to be the same as that of the second holes 10d. Reference numeral 32 denotes a terminal of the collector.

Figure 7A:
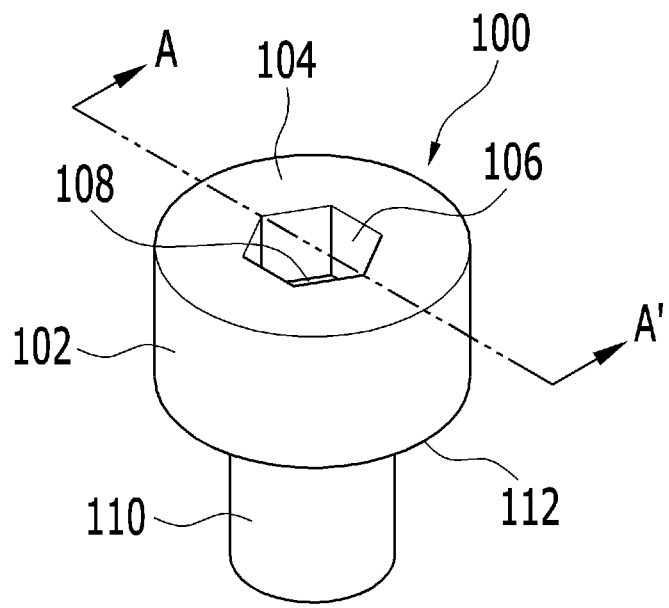
FIG. 7a is a perspective view of a pressing member according to the embodiment of the present invention.
Figure 7B:
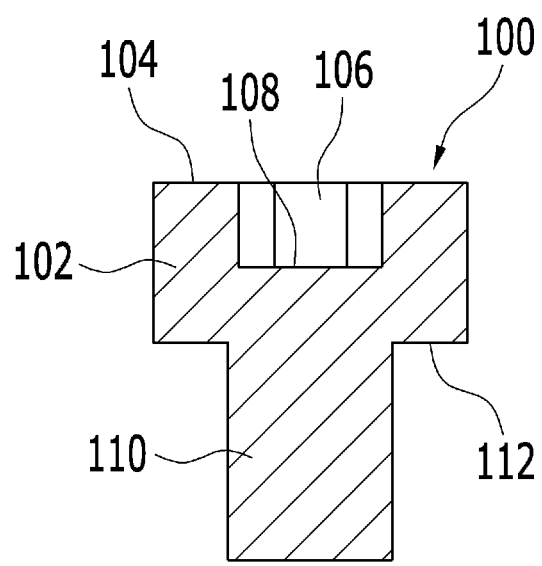

Next, the pressing member 100 used to fasten the transistor package 1 according to the present embodiment of the present invention will be described with reference to FIGS. 7a and 7b.

The pressing member 100 includes a head 102 formed in a circular column shape, and a rod 110 configured to protrude downward from the bottom surface of the center portion of the head 102 and formed to have a smaller diameter than the head 102. A coupling depression 106 having a hexagonal shape in the shown example is formed through the center portion of the top surface 104 of the head 102 to a predetermined depth, and the bottom surface of the coupling depression 106 is blocked by a support surface 108. Accordingly, when an operator inserts, for example, a hexagonally shaped wrench into the coupling depression 106 and rotates the hexagonally shaped wrench clockwise, the pressing member 100 moves forward, and thus the components are fastened to one another. In contrast, when the hexagonally shaped wrench is rotated counterclockwise, the pressing member 100 moves rearward, and thus the components are released from one another.

When the pressing member 100 is fastened through the center coupling holes 10a, 200a and 20a, the first metal plate 10, the insulating plate 200, the second metal plate 20 and the spacer 40 are sequentially fastened until the bottom surface 112 of the head 102 is caught on the support surface 10c' of the coupling hole 10a and does not move forward any longer, and the front end of the rod 110 comes into contact with the transistor chip 50.

When the pressing member 100 is fastened through the corner coupling holes 10a, 200a and 20a, the first metal plate 10, the insulating plate 200, the second metal plate 20 and the third metal plate 30 are sequentially fastened until the bottom surface 112 of the head 102 is caught on the support surface 100c of the coupling hole 10a and does not move forward any longer. The corner pressing member 100 does not come into contact with the spacer 40 or transistor chip 50.

As described above, when all the pressing members 100 are fastened by passing the pressing members 100 through the coupling holes, it may be possible to fasten the components from the first metal plate 10 to the third metal plate 30 while securing an electrical connection to the transistor chip 50. Conversely, when the pressing members 100 are moved rearward by rotating the pressing members 100 in the opposite direction, the components are released and separated from one another.

It will be understood from the above embodiment by those skilled in the art that the transistor chip 50 may include an IGBT, a MOSFET, a SiC Power semiconductor device, a GaN power semiconductor device, etc. as long as an electrical connection to the transistor chip 50 is secured and the present invention may be applied to any power semiconductor materials as long as the power semiconductor materials are based on gate, emitter and collector terminals.

Furthermore, the pressing members 100 according to the present embodiment is not limited to the above-described example, but may be constructed to use various types of physical pressing methods. For example, the pressing members 100 may be implemented in the form of Pogo pins that each include a spring and enhance contact force. Alternatively, the pressing members and the coupling holes may be coupled in a threaded manner, or push-type pressing members, other than rotation-type pressing members, may be employed. Alternatively, the pressing members may be fabricated in simple pin shapes.

2. Second Embodiment—Diode Package

Figure 8:
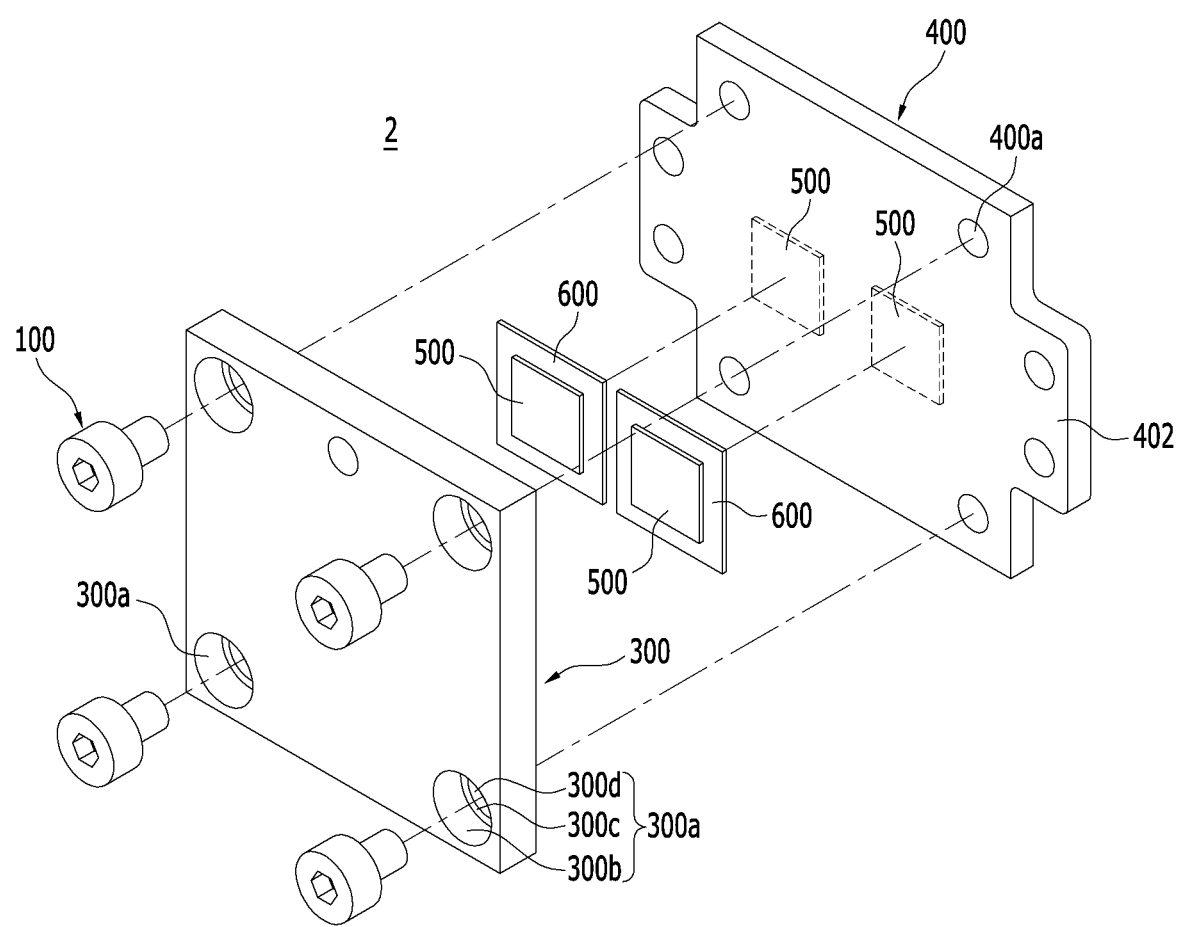
FIG. 8 is an overall perspective view of a diode package according to an embodiment of the present invention.

FIG. 8 is an overall perspective view of a diode module or package 2 according to a second embodiment of the present invention. The diode package 1 includes, sequentially from the front thereof: a first metal plate 300 connected to the anode terminals of diode chips, and configured to be responsible for anodes; and a second metal plate 400 connected to the cathode terminals of the diode chips, and configured to be responsible for cathodes. Spacers 500 and diode chips 600 are interposed between the first metal plate 300 and the second metal plate 400.

A structural feature of the diode package 2 according to the present embodiment of the present invention resides in that the first metal plate 300 and the second metal plate 400 are securely coupled to each other by using pressing members 100 in an integrated manner, the circuit terminals of each of the diode chips 600 are electrically connected to the first and second metal plates 300 and 400 accurately and stably, and electrical conductions are maintained.

As shown in FIG. 8, coupling holes 300a are formed in the four corners of the first metal plate 300. Each of the coupling holes 300a includes a first hole 300b formed in a circular opening shape, a support surface 300c configured to extend inward and horizontally from the lower end of the first hole 300b and formed in a rim shape, and a second hole 300d configured to extend downward from the support surface 300c. The diameter of the first hole 300b is larger than that of the second hole 300d. Since the diode package uses the two metal plates, the diode package does not require that the pressing member 100 is installed in the center as a gate pin in order to connect the front one of the metal plates to the transistor chip 50, unlike in the first embodiment.

The above-described structures are constructed in accordance with the electrical connections among the components and the shapes of the pressing members 100 by way of example, and thus the structures and shapes of the coupling holes 300a may be appropriately changed. The installation locations and sizes of the pressing members 100 may be also appropriately changed, and do not limit the scope of the present invention.

The spacer 500 and diode chip 600 according to the present embodiment of the present invention are disposed in such a manner that the spacer 500 made of an electrically conductive material is disposed on a front side and the diode chip 600 having a larger area than the spacer 500 is disposed on a back side.

Pattern lines corresponding to a circuit pattern formed on the top surface of the diode chip 600 are formed on the spacer 500. Since these pattern lines are electrically connected through contact, the first metal plate 20 located in front of the spacer 500 is electrically connected to the anode terminal of the diode chip 600, and thus secures conductivity. Furthermore, the second metal plate 400 that comes into contact with a circuit pattern on the back surface of the diode chip 600 is electrically connected to the cathode terminal and thus secures conductivity.

Coupling holes 400a are formed in the four corners of the second metal plate 400. The coupling holes 400a are formed at locations that are aligned with those of the coupling holes 300a. The diameter of the coupling holes 400a may be formed to be the same as that of the second holes 300d. Reference numeral 402 denotes the terminals of the cathodes.

The pressing members 100 used to fasten the diode package 2 according to the present embodiment of the present invention are the same as those of the first embodiment.

When the pressing members 100 are fastened through the corner coupling holes 300a and 400a, the first metal plate 300 and the second metal plate 400 are fastened until the bottom surfaces 112 of the heads 102 are caught on the support surfaces 300c of the coupling holes 300a and do not move forward any longer, and secure electrical connections with the spacers 500 and the diode chips 600. The pressing members 100 do not come into contact with the spacers 500 or diode chips 600. Conversely, when the pressing members 100 are moved rearward by being rotated in the opposite direction, the components are released and separated from one another.

It will be understood from the above embodiment by those skilled in the art that the diode chip 600 may include a rectifier diode, a constant-voltage diode, a constant-current diode, a detection diode, etc. as long as an electrical connection to the transistor chip 50 is secured and the present invention may be applied to any power semiconductor materials as long as the power semiconductor materials are based on anode and cathode terminals.

Although the above-described embodiment of the present invention uses the metal plates having a 3-layer structure or 2-layer structure, the present invention may be also applied to a 4 or more layer structure according to the type of power device.

Furthermore, when the chip of a power device is of a 3-terminal type or 3-source type, the present invention is not limited to the transistor chip 50, but may be widely applied to metal plates having a 3-layer structure. Furthermore, when the chip of a power device is of a 2-terminal type or 2-source type, the present invention is not limited to the diode chip 600, but may be widely applied to metal plates having a 2-layer structure.

3. Combined Transistor and Diode Package

In semiconductor processes, semiconductor power device packages are fastened in various manners. According to the present invention using pressing members 100, a combined package may be constructed using terminals and a bridge related to packages.

Figure 9:
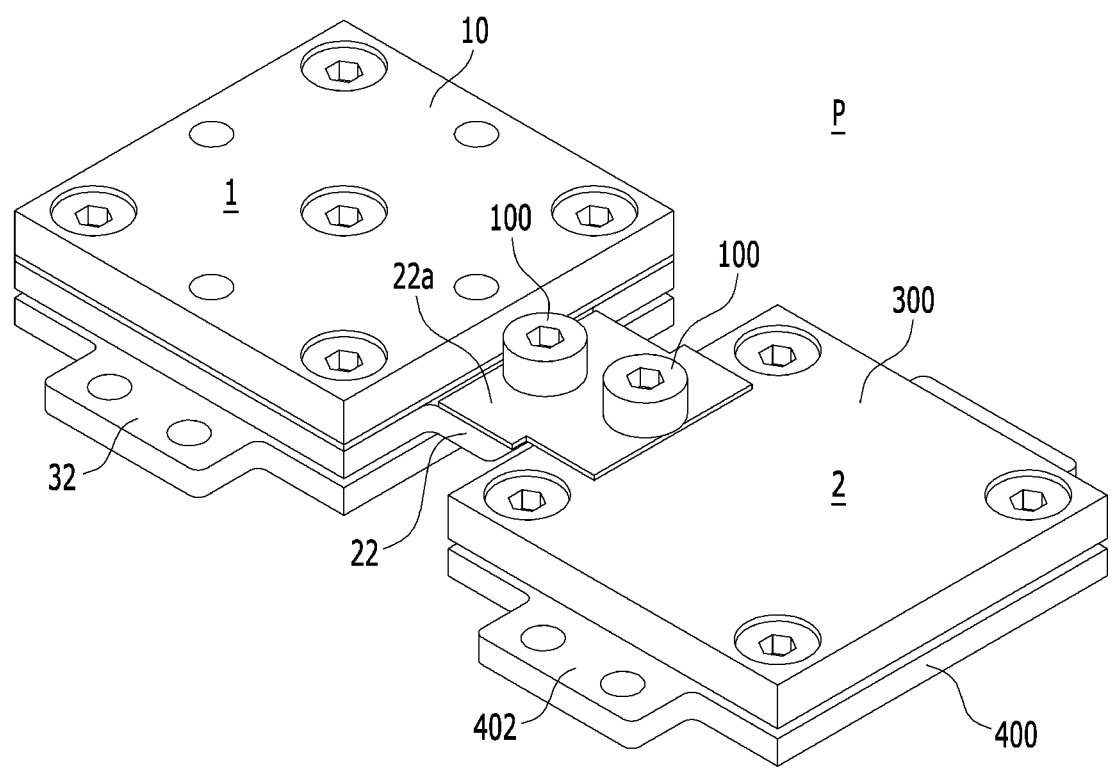
FIG. 9 is a perspective view of a combined package in which a transistor package and a diode package are horizontally adjacent to each other.

For example, FIG. 9 is a perspective view of a combined package P in which a transistor package 1 and a diode package 2 are horizontally adjacent to each other.

The top surface of the terminal 22 of a second metal plate 20 configured to be responsible for an emitter and the top surface of the first metal plate 300 of a diode package 2 configured to be responsible for an anode are connected to each other by a stepped conductive bridge 22a. One side of the bridge 22a is fastened to the top surface of the terminal 22 by a pressing member 100, and the other side of the bridge 22a is fastened to the top surface of the first metal plate 300 by a pressing member 100. Via this structure, an electrical connection is established between the emitter of the transistor package 1 and the anode of the diode package 2.

Meanwhile, a single-layer or multilayer type vertical connection between the transistor package 1 and the diode package 2 is disclosed in Korean Patent Application No. 10-2018-0007983 filed on Jan. 22, 2018 by the present applicant, which is hereby incorporated by reference herein in its entirety. In order to vertically connect packages, the pressing members 100 may further protrude downward and be inserted into the coupling holes of another package, or the packages may share a metal plate.

As described above, it is noted that the semiconductor device packages of the present invention described in the first and second embodiments have open structures that may be connected to and used in conjunction with other packages.

According to the present invention, the advantages that may be obtained by forming a semiconductor power device into a semiconductor package by means of a physical pressing method without using any adhesive, such as solder, are as follows:

First, the semiconductor package is not limited by the melting point of a conductive adhesive and may operate at high temperature, thereby providing the advantage of improving the durability of the semiconductor package itself.

Second, expensive silver sintering or copper paste is not required, thereby providing the advantage of reducing assembly cost, and a bonding process, such as soldering, wire bonding, or welding, is omitted, thereby providing the advantage of improving production efficiency.

Third, when an assembly defect or device breakage is found through characteristic inspection after the completion of the assembly of a semiconductor package, there is provided the advantage of conveniently disassembling and reassembling the semiconductor package.

While the present invention has been described based on some embodiments, these are examples, do not limit the scope of the present invention, and may be modified and practiced in various manners without departing from the technical spirit and scope of the present invention.

What is claimed is:

1. A semiconductor power device package, comprising:
   at least one upper metal plate located above a device; and
   at least one lower metal plate located below the device;
   wherein the device is a transistor chip, the at least one upper metal plate comprises, sequentially from a top thereof, a first metal plate responsible for a gate and a second metal plate responsible for an emitter, and the at least one lower metal plate comprises a third metal plate responsible for a collector,
   wherein one or more coupling holes are formed in each of the at least one upper and lower metal plates, and the at least one upper and lower metal plates are fastened and structurally connected by pressing members passing through the coupling holes, so that electrical connections are established among the device and the at least one upper and lower metal plates.

2. The semiconductor power device package of claim 1, wherein each of the pressing members comprises a head that is disposed in an upper portion of the pressing member and a rod that protrudes downward from a bottom surface of the head, wherein a coupling depression is formed in a center portion of a top surface of the head.

3. The semiconductor power device package of claim 1, wherein each of the pressing members is formed in a pin shape.

4. The semiconductor power device package of claim 1, wherein threads are formed on a rod or coupling depression of each of the pressing members.

5. The semiconductor power device package of claim 1, wherein at least one coupling hole is formed in a center of the first metal plate and at least one coupling hole is formed in a corner or side-adjacent portion of the first metal plate, at least one coupling hole is formed in a center of the second metal plate and at least one coupling hole is formed in a corner or side-adjacent portion of the second metal plate at locations corresponding to locations of the coupling holes of the first metal plate, and at least one coupling hole is formed in a corner or side-adjacent portion of the third metal plate at locations corresponding to locations of the coupling holes of the second metal plate.

6. The semiconductor power device package of claim 5, wherein the transistor chip is mounted on a top surface of the third metal plate, and a conductive spacer that is electrically connected to the second metal plate is installed above the transistor chip.

7. The semiconductor power device package of claim 6, wherein a slot having a size larger than a diameter of the pressing members is formed in the spacer, and the pressing member having passed through the coupling hole in the centers of the first metal plate and the second metal plate passes through the slot of the spacer and comes into contact with the transistor chip, so that an electrical connection with the first metal plate and the transistor chip are established.

8. The semiconductor power device package of claim 1, wherein the transistor chip is one of an IGBT, a MOSFET, a SiC semiconductor power device, and a GaN semiconductor power device.

9. An electronic device, comprising the semiconductor power device package of claim 1.

* * * * *